(12) United States Patent
Sundahl

(10) Patent No.: US 6,777,870 B2
(45) Date of Patent: Aug. 17, 2004

(54) ARRAY OF THERMALLY CONDUCTIVE ELEMENTS IN AN OLED DISPLAY

(75) Inventor: Robert C. Sundahl, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 225 days.

(21) Appl. No.: 09/897,738

(22) Filed: Jun. 29, 2001

(65) Prior Publication Data

US 2003/0001488 A1 Jan. 2, 2003

(51) Int. Cl.⁷ .................................................. H01J 1/62
(52) U.S. Cl. ........................ 313/504; 313/502; 313/503; 313/504; 313/498; 445/24; 438/99
(58) Field of Search ................................ 313/504, 498; 438/99; 445/24

(56) References Cited

U.S. PATENT DOCUMENTS

| | | | |
|---|---|---|---|
| 4,394,600 A | * | 7/1983 | Flannagan .................. 313/500 |
| 5,173,839 A | | 12/1992 | Metz, Jr. |
| 5,396,403 A | | 3/1995 | Patel |
| 5,644,327 A | | 7/1997 | Onyskevych et al. |
| 5,903,246 A | | 5/1999 | Dingwall |
| 5,952,789 A | | 9/1999 | Stewart et al. |
| 6,091,194 A | * | 7/2000 | Swirbel et al. ............. 313/498 |
| 6,175,345 B1 | * | 1/2001 | Kuribayashi et al. ......... 345/76 |
| 6,191,433 B1 | | 2/2001 | Roitman et al. |
| 6,228,228 B1 | * | 5/2001 | Singh et al. ............. 204/192.1 |
| 6,274,978 B1 | * | 8/2001 | Roach et al. ............... 313/483 |
| 6,412,971 B1 | * | 7/2002 | Wojnarowski et al. ...... 362/249 |
| 6,514,782 B1 | * | 2/2003 | Wierer et al. ................. 438/22 |

\* cited by examiner

*Primary Examiner*—Nimeshkumar D. Patel
*Assistant Examiner*—Holly Harper
(74) *Attorney, Agent, or Firm*—Fish & Richardson P.C., P.A.

(57) ABSTRACT

An organic light emitting diode (OLED) display includes an array of OLED pixels that generate heat and an array of thermally conductive elements positioned between the OLED pixels and a thermally conductive back panel. In one embodiment of the invention, the thermally conductive elements may be solder joints deposited over cathode contacts and anode contacts at each OLED pixel. The solder joints provide a path of low thermal resistance from the OLED pixels to the back panel. Also, the solder joints may serve as an array of electrical connections from back panel interconnects to the cathode lines and anode lines.

22 Claims, 8 Drawing Sheets

FIG. 8

ARRAY OF THERMALLY CONDUCTIVE ELEMENTS IN AN OLED DISPLAY

TECHNICAL FIELD

This invention relates to organic light emitting diode (OLED) displays.

BACKGROUND

Organic light emitting diodes (OLEDS) are made from luminescent organic materials that generate light when a direct current is passed through the materials. Certain characteristics of OLEDs make them appealing to those skilled in the art of electronic display technology. For example, OLEDS have a low operational voltage, a relatively high brightness, and the ability to emit different colors of light. OLED displays may be used in many applications such as displays for portable electronic devices, flat screen computer displays, or automobile stereo displays.

A typical OLED display includes an array of OLEDs formed on a glass plate or other transparent substrate. A stack of organic layers, including an electroluminescent layer, is packed between a cathode layer and an anode layer. The cathode layer and the anode layer provide the electrical power to the OLEDs in order to emit light from the diodes. The cathode layer includes a series of cathode lines, which form the pixel rows of the display, and the anode layer includes a similar series of anode lines to form the pixel columns. Solder connections have been used to electrically connect cathode and anode lines to an external drive circuit, but only through connections at the edges of the display. Typically, a pixel in the OLED flat panel display comprises a group of three OLED sub-pixels of different colors.

In prior art OLED flat panel displays, active elements, such as the cathode lines, anode lines, and diodes, are packed between a front panel and a back panel. An epoxy adhesive covering the active elements couples the front panel and back panel together. The glass material of the front panel and the epoxy material covering the OLEDs are poor thermal conductors compared to the solder connections at the edge of the display. The thermal insulation of the epoxy and glass material surrounding the all or most of the OLEDs throughout the pixel array cause a high operating temperature of the OLEDs. Also, the OLEDs further from the edges of the display have a greater level of thermal insulation than the OLEDs on the edge of the display. Thus, the operating temperatures of OLEDs vary with the OLEDs further from the edges of the display having higher temperatures.

The power consumption of an OLED integrated into a flat panel display may be enough to significantly raise the operating temperature of the diode. Higher levels of brightness in OLED flat panel displays may result in a greater level of heat generation per diode. The operational life and the efficiency of the OLED display are two significant design issues that are impacted by operating temperature. For example, the aging effects of the OLEDs are accelerated by increased operating temperature and the efficiency of the OLEDs is decreased as the operating temperature is increased. The trend in OLED display technology is for higher levels of brightness and efficiency with longer life spans.

DESCRIPTION OF DRAWINGS

Like reference symbols in the various drawings indicate like elements.

DETAILED DESCRIPTION

Figure 1:
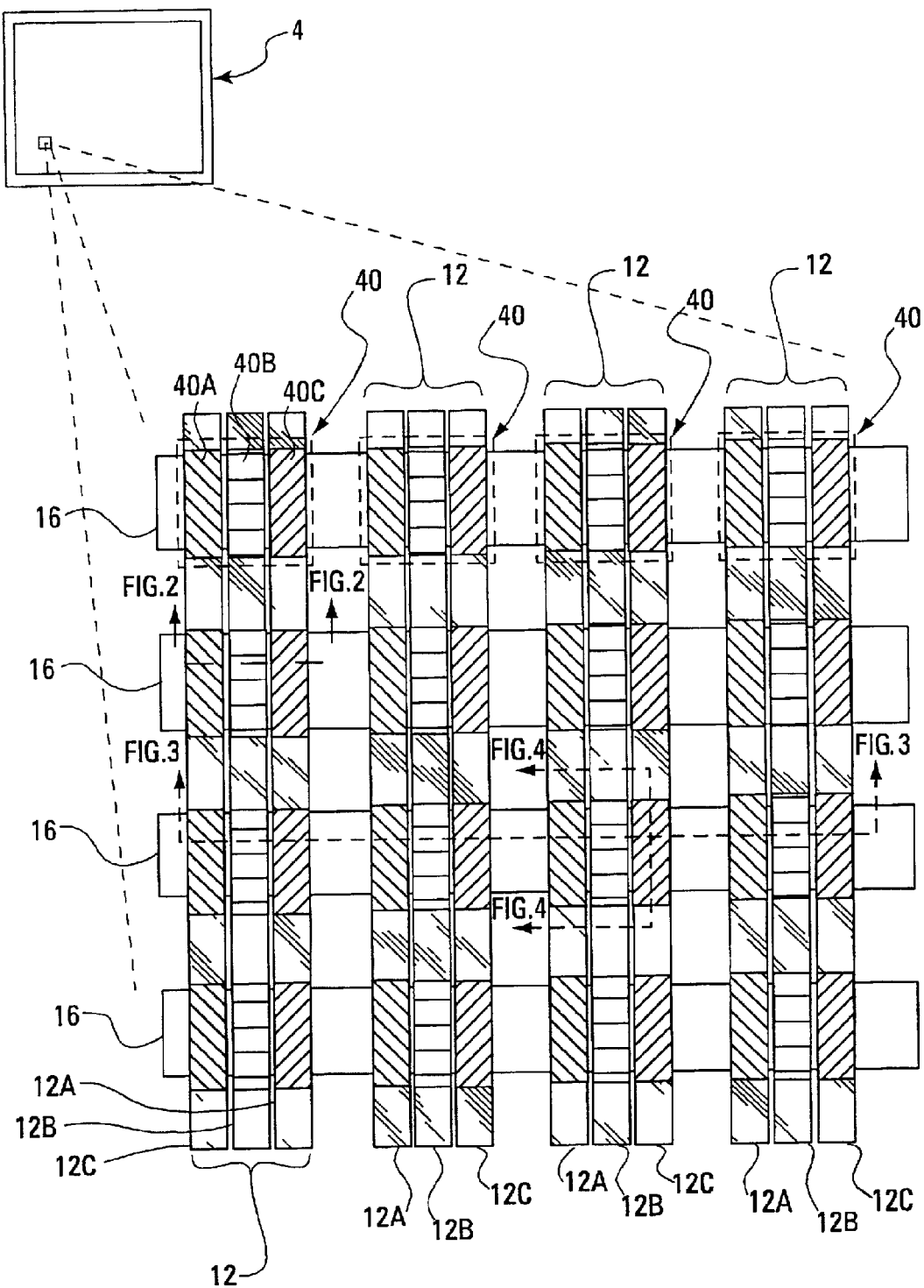
FIG. 1 is a view, from the perspective of a user, of an OLED flat panel display that may include aspects of the invention.

An OLED flat panel display 4, which may include aspects of the invention, shown from the perspective of a user in FIG. 1 includes an array of OLED pixels 40. The array may include any number of columns and rows of the OLED pixels 40. For example, a standard display 4 with a 5.7-inch diagonal size may have 320 columns and 240 rows, and thus 76,800 total OLED pixels 40. The blow-out of FIG. 1 shows an array of only 16 pixels 40 out of the total number of OLED pixels 40 that make up the display 4.

Figure 2:
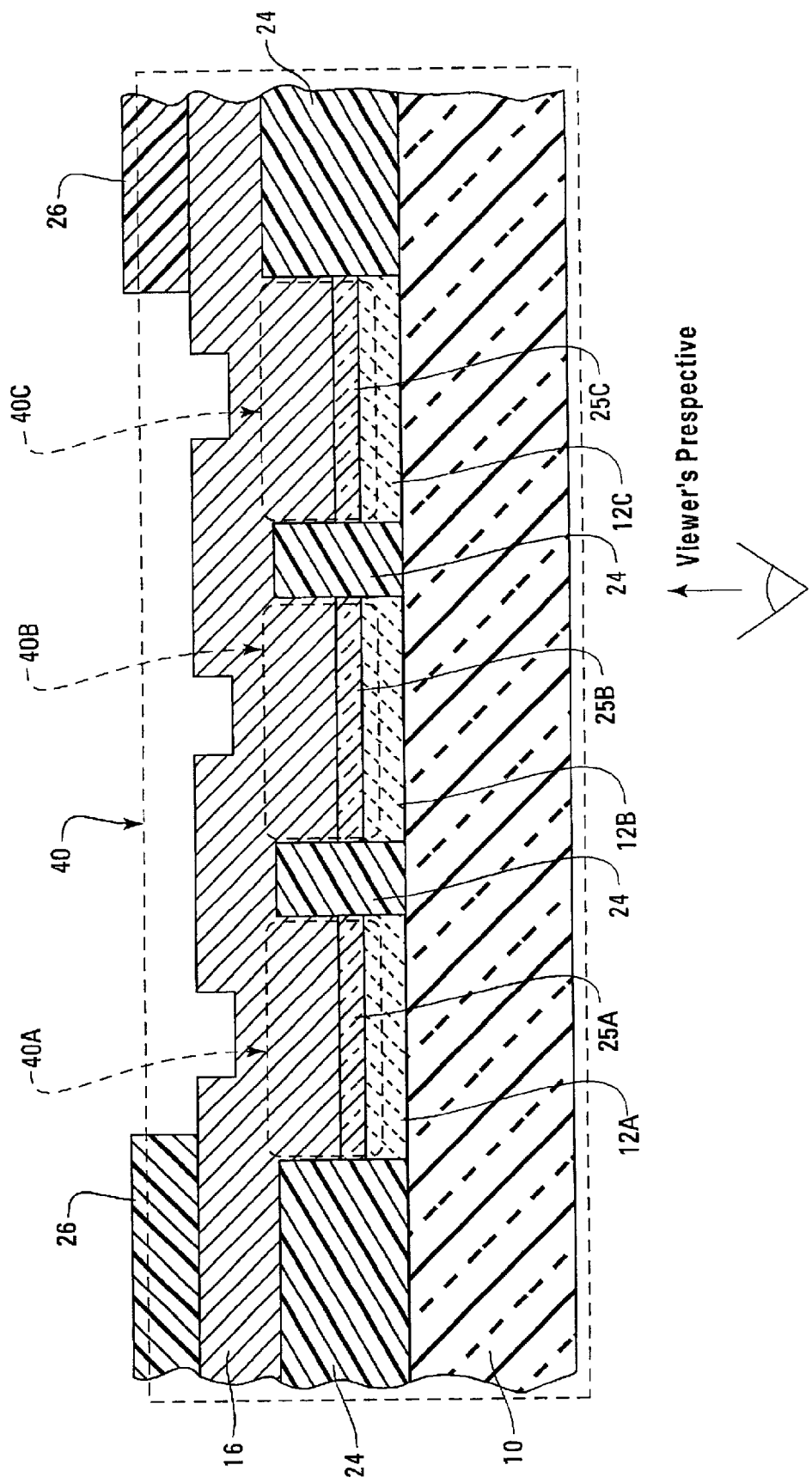
FIG. 2 is a cross-sectional view of a single pixel of the OLED flat panel display shown in FIG. 1.

Each OLED pixel 40 may have, as is conventional, three OLED sub-pixel regions 40A, 40B and 40C that emit different colors of light. One example is that sub-pixel region 40A emits red light, sub-pixel region 40B emits blue light, and sub-pixel region 40C emits green light, although other OLED colors and arrangements are within the scope of the invention. FIG. 2, a cross-sectional view of a single OLED pixel 40, shows that an OLED pixel 40 has an isolation layer 24 that separates the individual OLED sub-pixel regions 40A, 40B and 40C. The isolation layer 24 may be a polymer film, such as polyimide, as is conventional. The OLED pixel 40 also has three separate and differently formulated emissive layers 25A, 25B and 25C. Emissive layers 25A, 25B and 25C correspond respectively to OLED sub-pixel regions 40A, 40B and 40C. The make-up of the organic formulation in the emissive layer 25A, 25B or 25C dictates the color of light that the sub-pixel region 40A, 40B or 40C emits.

Referring back to FIG. 1, a plurality of cathode lines 16 extend horizontally from one side of the display 4 to the other. The number of cathode lines 16 in this embodiment corresponds to the number of rows of OLED pixels 40. Each cathode line 16 electrically connects to all of the OLED pixels 40 in a row. Also, as best shown in FIG. 2, each cathode line 16 electrically connects to all OLED sub-pixel regions 40A, 40B and 40C of the pixel 40. As shown in FIG. 1, a plurality of anode lines 12 extend vertically from the top of the display 4 to the bottom. The number of anode lines 12 in this embodiment corresponds to the number of columns of OLED pixels 40. Each anode line 12, as shown in FIG. 1 and also in FIG. 2, is made up of three separate anode lines 12A, 12B and 12C. Anode lines 12A electrically connect to all of the red OLED sub-pixel regions 40A in an OLED pixel 40 row; anode lines 12B, all of the blue OLEDs 40B in a row; and anode lines 12C, all of the green OLEDs 40C in a row. A layer of insulation material 26 may be used to provide protection for the cathode lines 16 and the anode lines 12, as is conventional.

In general, the OLED sub-pixel regions 40A, 40B, and 40C may be illuminated by a direct current that is passed through the OLED sub-pixel regions 40A, 40B, and 40C. A particular cathode line 16 may be turned to an "on" position, so a direct current may pass through the cathode line 16. Also, a particular anode line 12A, 12B, or 12C, or a combination thereof, may be turned to an "on" position. When a particular cathode line 16 and anode line 12A, for example, are "on" are on at the same time, a conductive path is provided for the direct current from the cathode line 16, through the OLED pixel 40, and to the anode line 12A. When the direct current passes through the OLED sub-pixel 40A, light is emitted from the sub-pixel 40A. The brightness of light that is emitted from the sub-pixel 40A, 40B, or 40C may be adjusted by controlling the amount of current passed through the cathode line 16 to the anode line 12A, 12B, or 12C.

Figure 3:
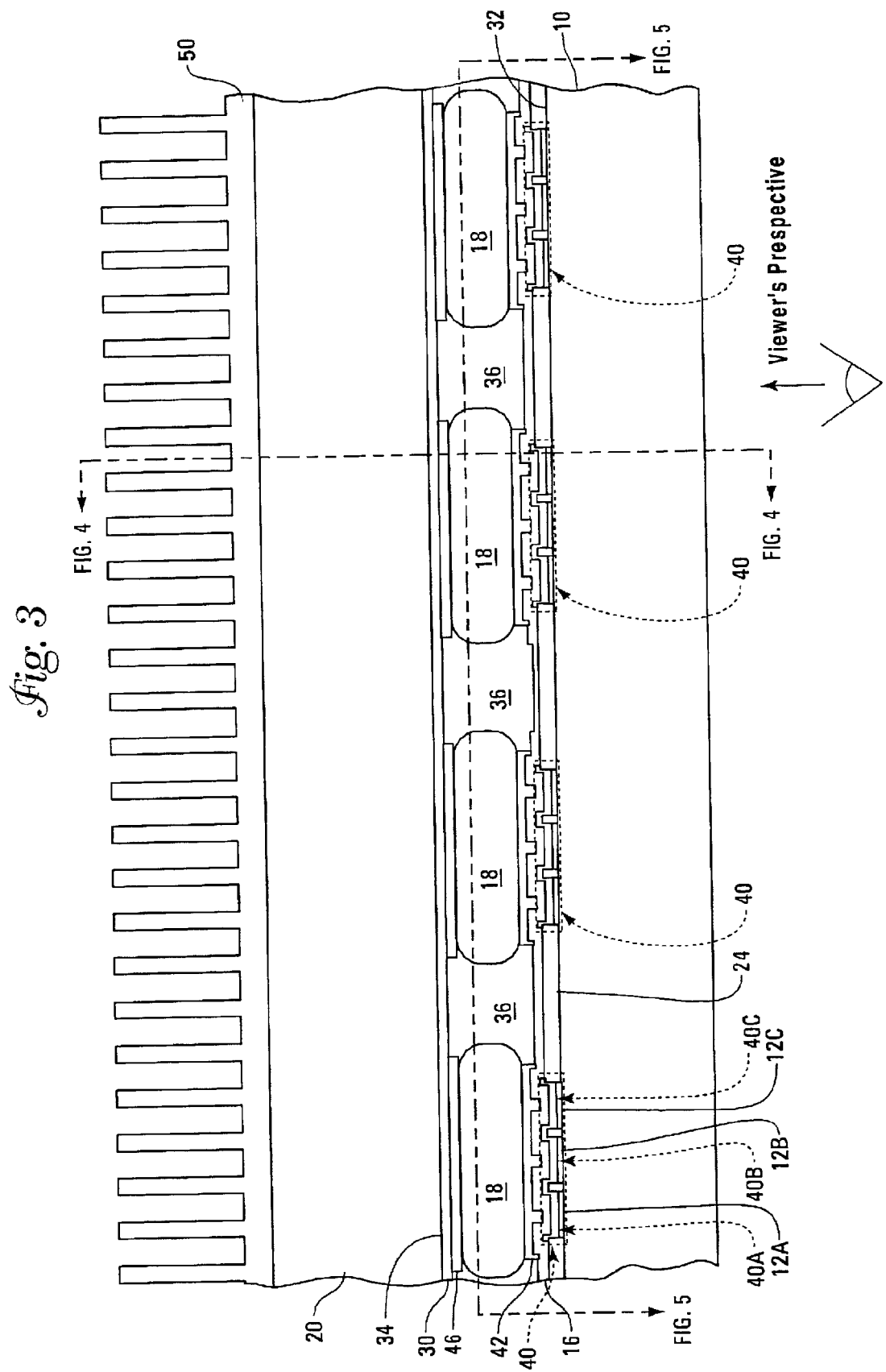
FIG. 3 is a cross-sectional view showing four pixels of the OLED flat panel display shown in FIG. 1.

In accordance with an aspect of the invention, the OLED display 4, a portion of which is shown in FIG. 3 in a horizontal cross-section extending parallel to a row of OLED pixels 40, includes a plurality of solder joints 18. Each solder joint 18 connects the cathode line 16, at a vicinity of an OLED pixel 40, with a back panel interconnect 30, which in turn, is attached to a back panel 20. In this embodiment, the solder joints 18 along the cathode line 16 are connected to a single interconnect 30, but the solder joints 18 may be connected to separate back panel interconnects 30. The back panel 20 may be made of a ceramic material, such as alumina, or any other suitable circuit board material. It is desirable to have a back panel 20 made of a material with a high thermal conductivity. Solder joints 18 may connect electrical contacts 46 on the back panel interconnect 30 to cathode contacts 42 on the cathode lines 16 at each pixel 40. Other back panel interconnects 39 are connected to anode contacts 44 (not shown in FIG. 3), which may be in close proximity to each pixel 40. Thus, in this particular embodiment of the invention, an array of solder joints 18 forms electrical connections to the cathode lines 16 and anode lines 12 at each pixel 40 in the display 4. The solder joints 18 also provide a path of low thermal resistance from the OLED pixels 40 to the back panel 20, and thus serve to dissipate heat generated by the OLED pixels 40 to the back panel 20. In the embodiment shown in FIG. 3, there is a one-to-one correspondence between the solder joints 18 and the OLED pixels 40.

Figure 4:
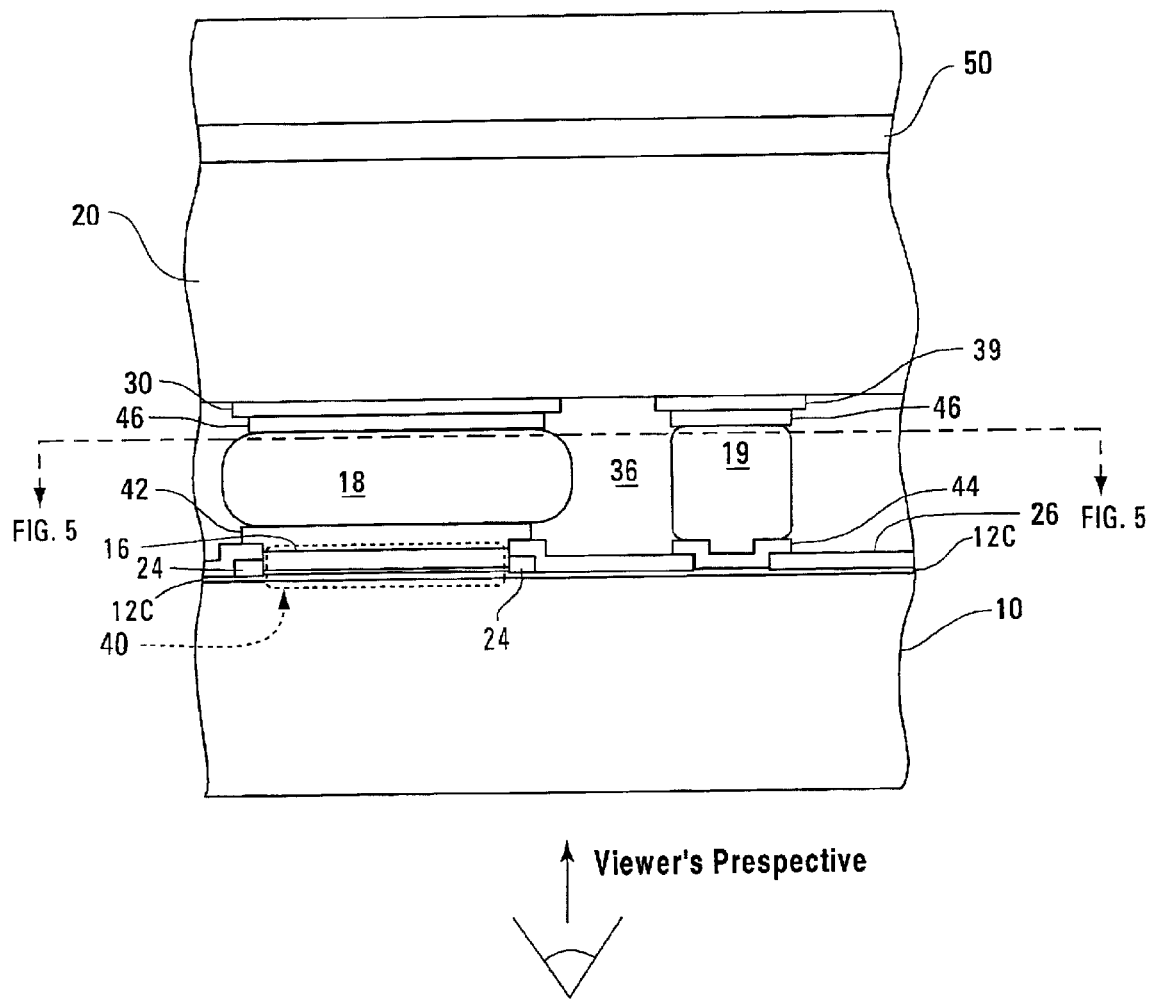
FIG. 4 is a cross-sectional view of the portion of the OLED flat panel display shown in FIG. 1.

FIG. 4 shows a cross-sectional view of a pixel 40 of the OLED flat panel display 4 shown in FIG. 1. The cross section is taken vertically and parallel to a column of OLED pixels 40. As shown in FIG. 4, solder joints 18 connect the contacts 46 of the back panel interconnect 30 to the cathode contacts 42, in a manner already described. Solder joints 19 connect the electrical contacts 46 of the back panel interconnect 39 to the anode line 12C for sub-pixels 40C. Accordingly, each of the anode lines 12A, 12B, and 12C may be connected to separate back panel interconnections 39. The connections to the back panel contacts 46 are accomplished with the solder joints 19 on anode contacts 44 in close proximity to each pixel 40, as shown in FIG. 4.

Referring to FIGS. 3 and 4, the front panel 10 of the flat panel display 4 serves as a substrate for the OLED pixels 40 during the manufacturing process. The front panel 10 may be made of glass or another transparent material. The anode lines 12, the OLED pixels 40, the isolation material 24, and the cathode lines 16 are formed on a surface of the front panel 10 in a conventional manner. The insulation layer 26 may be formed over the cathode lines 16 and anode lines 12, while leaving small, exposed areas over the cathode lines and anode lines for placement of the contacts 42 and 44. After this is done, the cathode contacts 42 and the anode contacts 44 are formed at each pixel 40 in the exposed areas, and the solder joints 18 are formed on the contacts 42 and 44. The back panel 20 is fabricated with interconnects 30 and 39 and the electrical contacts 46. The back panel 20 is assembled with the front panel 10 using the solder joints 18 and 19 to connect the electrical contacts 46 to the appropriate cathode and anode contacts 42 and 44. This process of assembling the back panel 20 with the front panel 10 may be a solder reflow operation, as is known to those skilled in the art. Then an epoxy material 36, or a conventional filler material, is injected into the volume between the back panel 20 and the front panel 10. The epoxy material 36 is cured such that it occupies the space between the solder joints 18 and permanently affixes the back panel 20 to the front panel 10. A heat fin 50 may be coupled to the ceramic back panel 20 to increase the amount of heat dissipation from the OLED pixels 40.

Figure 5:
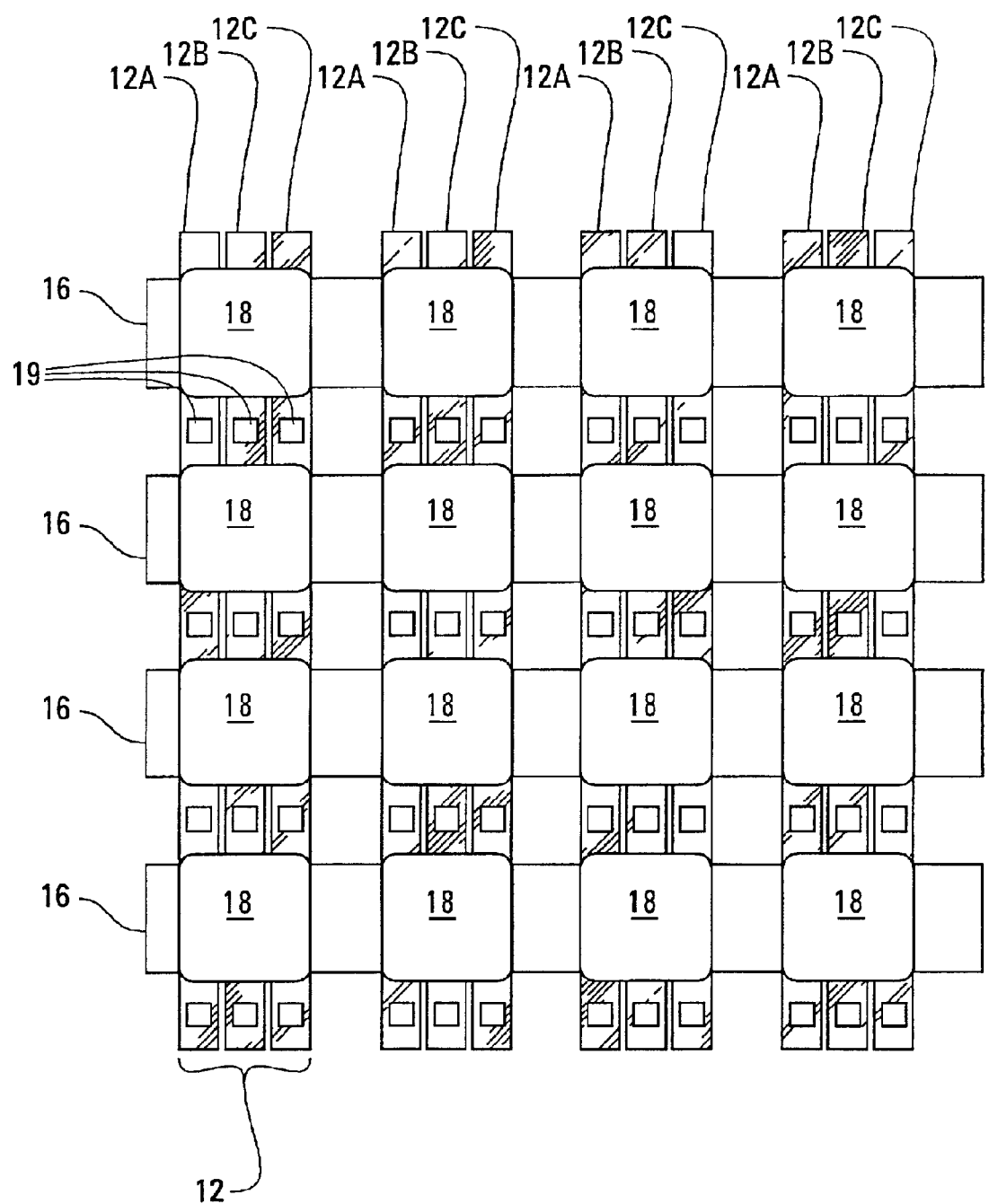
FIG. 5 is a cross-sectional top view of the portion of the OLED flat panel display shown in FIG. 3.

FIG. 5 shows a cross-sectional view of the portion of the OLED flat panel display 4 shown in FIGS. 3 and 4 with the epoxy adhesive 36 removed to better view the anode lines 12 relative to the cathodes line 16. The solder joints 18 contact the cathode lines 16 at each pixel 40 (the pixel 40 not shown in this figure), and the solder joints 19 contact the three anode lines 12A, 12B, and 12C next to each pixel 40 in the pixel array. Thus, the solder joints 18 and 19 form an array pattern distributed throughout the array of OLED pixels 40 to form a thermal shunt from the OLED pixels 40 to the back panel 20 (the back panel 20 not shown in this figure).

Having solder joints 18 and 19 distributed throughout the pixel array serves at least two purposes. First, the array of solder joints 18 and 19 may act as electrical connections from the back panel interconnect 30 to the cathode lines 16 and anode lines 12 at each pixel 40, unlike the prior art, where there were electrical connections only at the edge of the OLED display. The electrical connection from the back panel interconnects 30 and 39 to the contacts 42 and 44 at each pixel 40 provides a lower total electrical resistance from a power source to the OLED sub-pixel regions 40A, 40B, and 40C when compared to the prior art. This provides a reduction in circuit parasitics because the back panel interconnect 30 is used to electrically connect to the cathode contacts 42 and anode contacts 44 throughout the pixel array.

Second, the array of solder joints 18 and 19 improves the heat dissipation from the OLED sub-pixel regions 40A, 40B, and 40C. The OLED sub-pixel regions 40A, 40B, and 40C generate heat while in operation, and the operating temperature of the OLED sub-pixel regions 40A, 40B, and 40C impacts the efficiency and the life span of the OLED sub-pixel regions 40A, 40B, and 40C. The current invention uses a solder joint 18 at the cathode contact 42 and solder joints 19 at the anode contacts 46 for each pixel 40 to act as a thermal shunt for heat dissipation. The heat is dissipated from the OLED pixels 40, though the solder joints 18 and 19, and to the back panel 20. Also, the heat fin 50 and a conventional cooling fan may further increase the heat dissipation from the back panel 20 to the ambient air. The operating temperature and the temperature variation of the OLED pixels 40 for a given power dissipation is thus reduced, which increases the life span and the efficiency of the OLED pixels 40.

Figure 6:
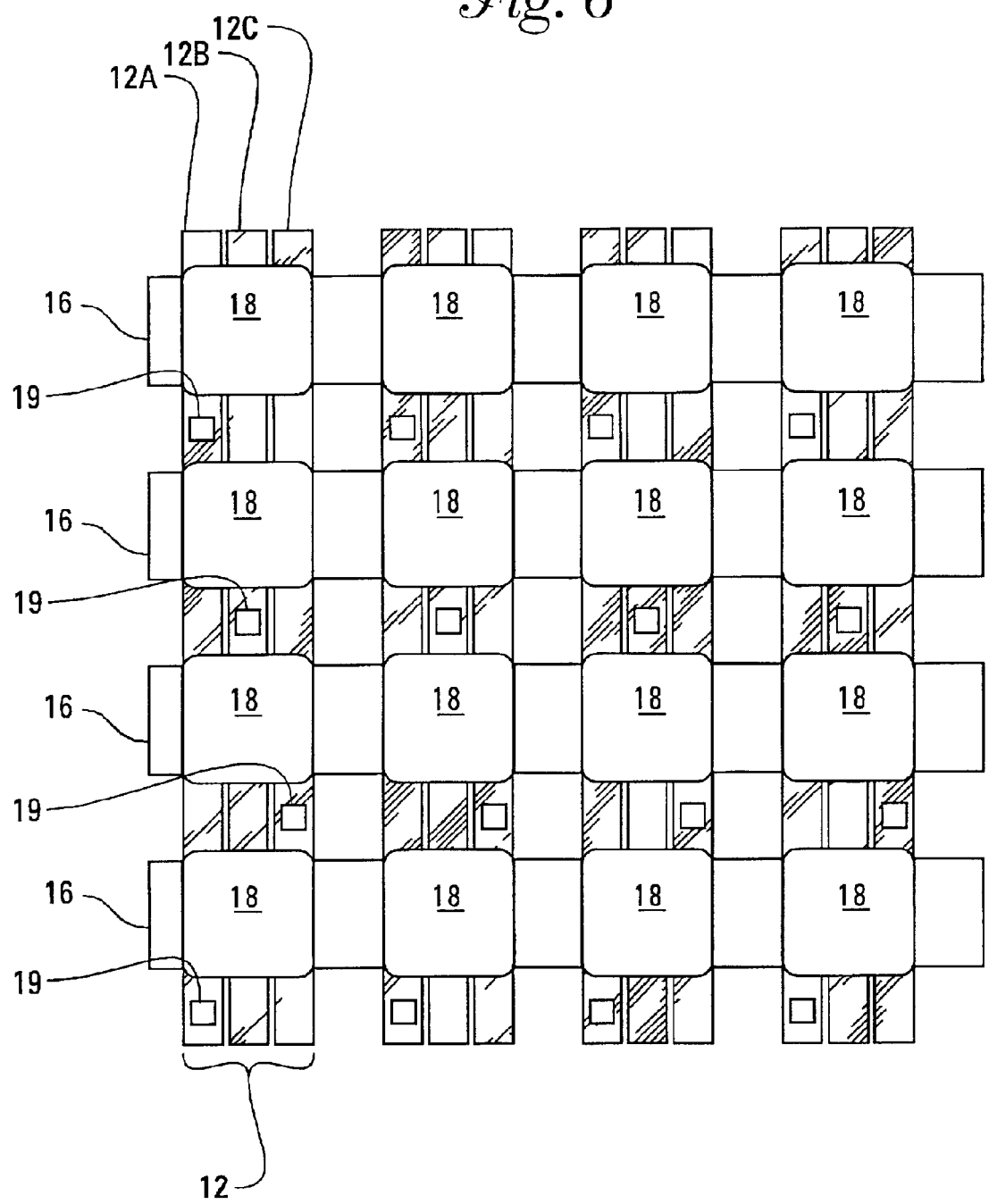
FIG. 6 is a cross-sectional top view of the portion of an OLED flat panel display, similar to the view shown in FIG. 5, in accordance with another embodiment of the invention.

FIG. 6 shows an alteration of the embodiment shown in FIG. 5. The spacing of the anode lines 12A, 12B, and 12C may be too close for depositing solder joints 19 on the anode lines 12A, 12B, and 12C at each pixel 40. Also, it may not be necessary for there to be solder joints 19 at all the pixels 40 for satisfactory heat dissipation. Therefore, in the FIG. 6 embodiment, the solder joints 18 contact the cathode lines 16 at each pixel 40 (the pixel 40 not shown in FIG. 6), but the solder joints 19 contact only a single anode line 12A, 12B or 12C at each pixel 40. In this case, the solder joints 19 contact the left-most anode lines 12A for the pixels 40 that share a common cathode line 16, the middle anode lines 12B for the pixels 40 that share the next cathode line 16, and the right-most anode lines 12C for the pixels that share the third cathode line 16. Then the pattern of solder joints 19 contacting the anode lines 12A, 12B, and 12C repeats for the pixels 40 that share subsequent cathode lines 16.

Using the solder joints 18 as electrical connections to the cathode line 16 at each pixel 40 may provide a high level of redundant electrical connections and interconnect 30 routing complexity. Some redundancy may not be needed in some cases; however, the solder joints 18 still provide important heat dissipation from the pixels 40. Accordingly, in a further embodiment of the invention, the solder joints 18 are used to dissipate heat from at each pixel 40, but the back panel interconnect 30 does not electrically connect to every solder joint 18. For example, the contact 46 of a solder joint 18 may be affixed directly to the back panel 20 instead of to an interconnect 30, while the contact 46 corresponding to a neighboring solder joint 18 is affixed to an interconnect 30 and the cathode line 16 over a neighboring pixel 40. Thus, each of the OLED pixels 40 in the pixel array benefits from the heat dissipation of the solder joints 18, but only a portion of the solder joints 18 distributed throughout the pixel array are used as electrical connections to the interconnect 30.

Figure 7:
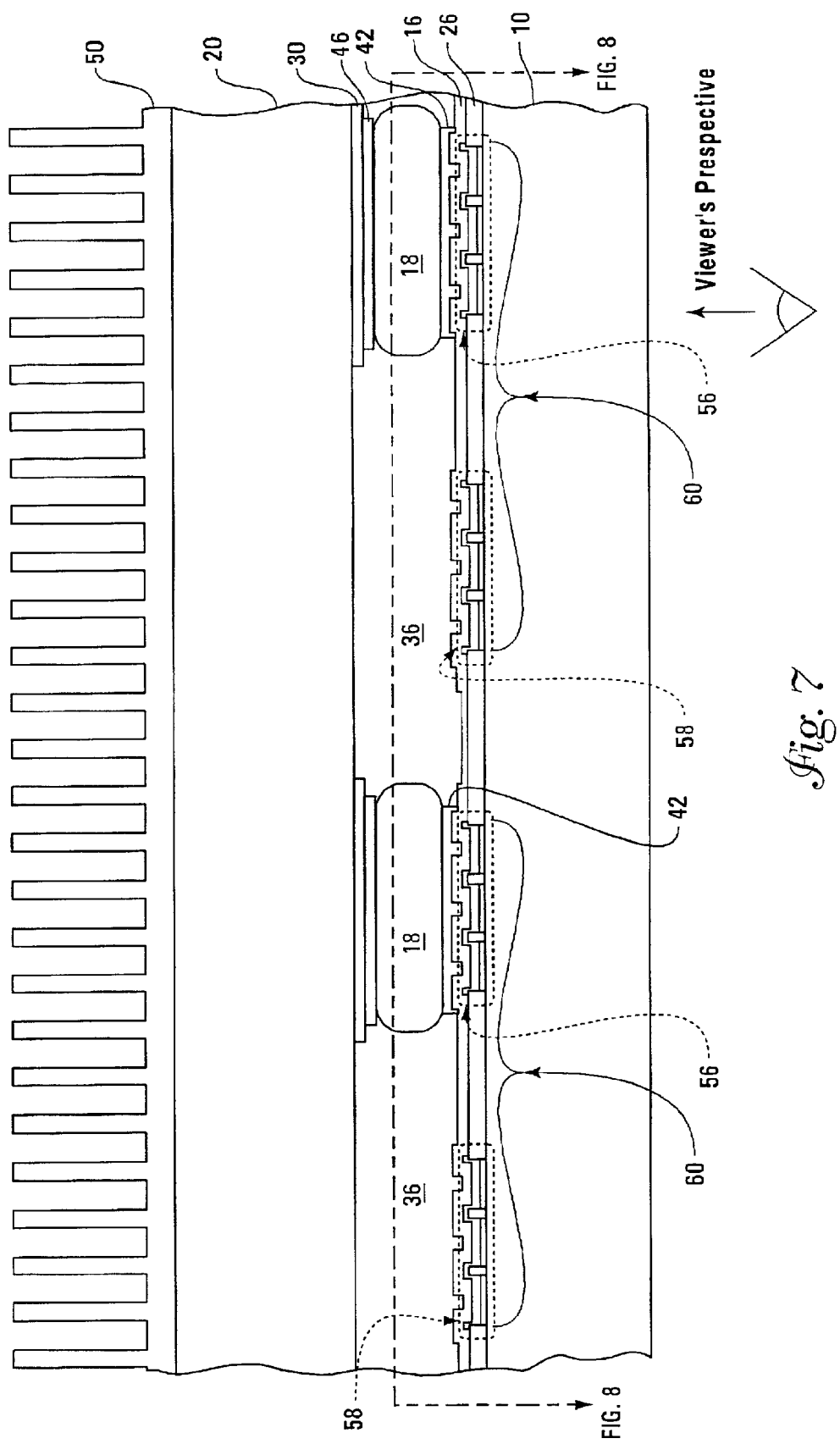
FIG. 7 is a cross-sectional view showing four pixels of an OLED flat panel display, similar to the view shown in FIG. 3, in accordance with another embodiment of the invention.
Figure 8:
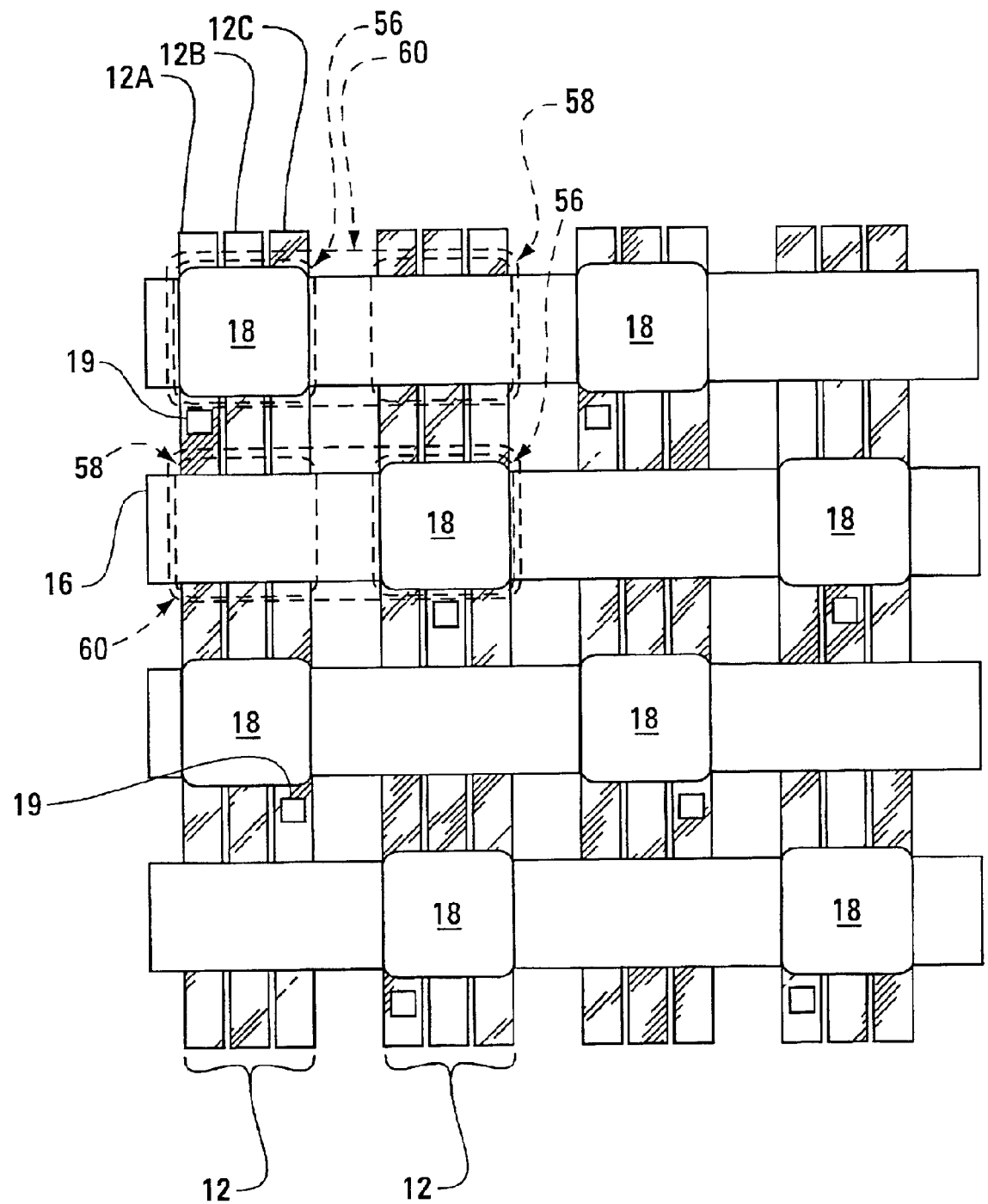
FIG. 8 is a cross-sectional top view of the portion of the OLED flat panel display shown in FIG. 7.

Another embodiment of the invention is shown in FIG. 7 by a cross-sectional view of four pixels along a cathode line 16. FIG. 7 is a cross-sectional view similar to that in FIG. 3. Also, FIG. 8 shows a cross-sectional top view of this embodiment of the invention similar to the FIG. 5 view. In FIG. 8, the epoxy adhesive 36 and the insulating material 26 were removed in order to better view the anode lines 12 relative to the cathode lines 16. This embodiment of the invention groups a small number of adjacent pixels 56 and 58 along each cathode line 16 into pixels subsets 60. In this embodiment, the solder joints 18 along the cathode line 16 are connected to separate back panel interconnects 30, but the solder joints 18 may be connected to a single interconnect 30. As shown in FIG. 8, the pixel subset 60 includes two adjacent pixels 56 and 58. However, a pixel subset 60 that includes a small number of pixels, such as six or eight adjacent pixels, is within the scope of the invention. In this particular embodiment, the invention uses a solder joint 18 at a single cathode contact 42 and a solder joint 19 at an anode contact 44 for each pixel subset 60. The pixel subset 60 includes a pixel 56 with the solder joint 18 and a neighboring pixel 58 that shares the electrical and thermal benefits of that solder joint 18. The solder joints 18 contact the cathode lines 16 at every other pixel 56 throughout the pixel array. The solder joints 18 along the subsequent cathode lines 16 are positioned such that the pixels 56 contacting the solder joints 18 are horizontally and vertically adjacent to pixels 58 without the solder joints 18. Thus, the heat dissipation is distributed among the OLED pixels 56 and 58 in a substantially uniform manner. This embodiment of the invention reduces the circuit parasitics and dissipates heat from the OLED pixels 56 and 58 by using an array of solder joints 18 generally distributed over all of the display 4 when compared to the prior art of using solder connections only at the edges of the display. Other arrangements may also be considered. The appropriate choice of pixel subset 60 arrangement depends on design rules, thermal properties of the materials and on the power load. Those skilled in the art of thermal modeling tools will find the appropriate choice of pixel subset arrangement in a straightforward manner.

A number of embodiments of the invention have been described. Nevertheless, it will be understood that various other modifications may also be made without departing from the spirit and scope of the invention. For example, the heat dissipation from the pixels 56 and 58 that share a solder joint 18 can be enhanced by using an appropriate choice of thickness and material for the cathode lines 16 of the front panel 10. For instance, changing the cathode line 16 material from aluminum to gold would improve the thermal conductivity between the pixels 56 and 58 and the shared solder joints 18. In a further embodiment, conventional methods for enhancing the heat dissipation from a circuit board may be applied. For example, a cooling fan may be used to force airflow over the back panel 20 or heat fin 50 and further aid in dissipating heat from the back panel 20. In another embodiment, the thermally and electrically conductive material for solder joints 18 and 19 may be a material other than conventional solder material, for example, a material with thermal conductivity similar to or greater than a solder material. Accordingly, other embodiments are within the scope of the following claims.

What is claimed is:

1. An OLED display, comprising;
   a back panel having at least one electrical interconnection line;
   a front panel substantially parallel to the back panel;
   an array of OLED pixels positioned between the front panel and the back panel, the array of OLED pixels having at least one centrally located OLED pixel that is formed at a non-edge location of the array, wherein the centrally located pixel has an anode contact located at the non-edge location; and
   a thermally conductive element on the anode contact at the non-edge location to electrically connect the anode contact and the electrical interconnection line of the back panel.

2. The display of claim 1, wherein the central pixel has a cathode contact located at the non-edge location, and a second thermally conductive element is formed on the cathode contact to electrically connect the cathode contact to the electrical connection line of the back panel.

3. The display of claim 1, wherein each OLED pixel comprises a plurality of OLED sub-pixel regions that emit different colors of light.

4. The display of claim 1, wherein the thermally conductive elements comprise solder.

5. The display of claim 1, wherein the back panel comprises a ceramic material.

6. The display of claim 1, further comprising an epoxy material to affix the front panel to the back panel.

7. The display of claim 1, further comprising a heat dissipating structure coupled to a surface of the back panel opposite to the front panel.

8. The display of claim 7, wherein the heat dissipating structure is a heat fin coupled to the surface of the back panel opposite to the front panel.

9. The display of claim 8, further comprising a cooling fan to force airflow over the heat fin.

10. The display of claim 1, wherein the centrally located pixel generates heat when electrical current is conducted though the pixel.

11. The display of claim 10, wherein at least a portion of the heat generated by the centrally located pixel is dissipated to the back panel through at least one thermally conductive element in proximity to the pixel.

12. An OLED display, comprising:
 a back panel having at least one electrical interconnection line formed thereon;
 a front panel substantially parallel to the back panel; and
 an array of OLED pixels positioned between the front panel and the back panel, wherein each OLED pixel is operable to emit light when an electrical current is conducted though the OLED pixel between an anode line and a cathode line,
 wherein each cathode line is electrically connected to a corresponding electrical interconnection line of the back panel by thermally conductive elements formed at each OLED pixel and positioned between the cathode line and the corresponding electrical interconnection line;
 wherein each anode line is electrically connected to at least one electrical interconnection line of the back panel by thermally conductive elements formed at each OLED pixel and positioned between the anode line and the electrical interconnection line of the back panel.

13. The display of claim 12, wherein each OLED pixel comprises a plurality of OLED sub-pixel regions that emit different colors of light.

14. The display of claim 12, wherein the back panel comprises a ceramic material.

15. The display of claim 12, further comprising an epoxy material to affix the front panel to the back panel such that the epoxy material occupies the space between the thermally conductive elements.

16. The display of claim 12, wherein the thermally conductive elements comprise solder.

17. The display of claim 16, wherein each OLED pixel has:
 at least one cathode contact formed between the cathode line and the electrical interconnection line of the back panel; and
 a solder joint for each OLED pixel on the cathode contact between the OLED pixel and the back panel.

18. The display of claim 12, wherein each OLED pixel generates heat when electrical current is conducted though the OLED pixel.

19. The display of claim 18, wherein at least a portion of the heat generated by each OLED pixel is dissipated to the back panel through at least one thermally conductive element in proximity to the OLED pixel.

20. The display of claim 12, further comprising a heat dissipating structure coupled to a surface of the back panel opposite to the front panel.

21. The display of claim 20, wherein the heat dissipating structure is a heat fin coupled to the surface of the back panel opposite to the front panel.

22. The display of claim 21, further comprising a cooling fan to force airflow over the heat fin.

* * * * *